United States Patent
Rangan et al.

(10) Patent No.: US 6,714,044 B1
(45) Date of Patent: Mar. 30, 2004

(54) HI-SPEED PARALLEL CONFIGURATION OF PROGRAMMABLE LOGIC

(75) Inventors: Gopi Rangan, Santa Clara, CA (US); Khai Nguyen, San Jose, CA (US); Chiakang Sung, Milpitas, CA (US); Xiaobao Wang, Santa Clara, CA (US); In Whan Kim, San Jose, CA (US); Yan Chong, Sanford, CA (US); Philip Pan, Fremont, CA (US); Joseph Huang, San Jose, CA (US); Bonnie Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/106,673

(22) Filed: Mar. 25, 2002

(51) Int. Cl.[7] ........................ G06F 7/38; H03K 19/177; G11C 19/28
(52) U.S. Cl. ............................. 326/40; 326/46; 326/39; 377/79
(58) Field of Search .............................. 326/38, 39, 40, 326/41, 46; 377/79; 708/232

(56) References Cited

U.S. PATENT DOCUMENTS

| | | |
|---|---|---|
| 4,930,107 A | 5/1990 | Chan et al. |
| 5,200,920 A | 4/1993 | Norman et al. |
| 5,543,730 A | 8/1996 | Cliff et al. |
| 5,590,305 A | 12/1996 | Terrill et al. |
| 5,650,734 A | 7/1997 | Chu et al. |
| 5,680,061 A | 10/1997 | Veenstra et al. |
| 5,742,531 A | 4/1998 | Freidin et al. |
| 5,844,829 A | 12/1998 | Freidin et al. |
| 5,869,980 A | 2/1999 | Chu et al. |
| 5,873,113 A | 2/1999 | Rezvani |
| 5,961,576 A | 10/1999 | Freidin et al. |
| 5,995,988 A | 11/1999 | Freidin et al. |
| 6,011,406 A | 1/2000 | Veenstra |
| 6,018,559 A * | 1/2000 | Azegami et al. ............... 377/79 |
| 6,052,755 A | 4/2000 | Terrill et al. |

* cited by examiner

Primary Examiner—Daniel Chang
(74) Attorney, Agent, or Firm—Townsend and Townsend and Crew LLP

(57) ABSTRACT

Techniques and circuitry are used to more rapidly configuring programmable integrated circuits. Configuration data is input into a programmable integrated circuit in parallel via parallel inputs (705), and this data is also handled internally in parallel. The configuration data will be stored in a data register (722). This data register is segmented into two or more segments, each segment being made up of a serial chain of registers (808). The configuration data is input into the two of more segments of the data registers in parallel. Circuitry is also provided to handle redundancy.

22 Claims, 9 Drawing Sheets

HI-SPEED PARALLEL CONFIGURATION OF PROGRAMMABLE LOGIC

BACKGROUND OF THE INVENTION

The present invention relates to the field of programmable integrated circuits and in particular, to a techniques and circuitry for more rapidly configuring programmable integrated circuits.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, or look-up tables. Programmable logic integrated circuits also included embedded user-programmable memory or RAM.

Despite the success of programmable logic, there is a continuing desire to provide greater functionality in a programmable logic integrated circuit, but at the same time, provide greater performance. As programmable logic becomes more highly integrated, more logical functions are provided, and therefore, more configuration bits are required to program or configure the functionality. More configuration bits leads to longer configuration or programming times, which is undesirable. For example, this may cause relatively long system start-up times because programmable logic having volatile memory cells such as static RAM cells need to be reprogrammed upon power up.

Therefore, there is a need to provide techniques and circuitry for more rapidly configuration programmable integrated circuit.

SUMMARY OF THE INVENTION

The invention provides techniques and circuitry for more rapidly configuring programmable integrated circuits. Configuration data is input into a programmable integrated circuit in parallel, and this data is also handled internally in parallel. The configuration data will be stored in a data register. This data register is segmented or divided into two or more segments, each segment being made up of a serial chain of registers. The configuration data is input into the two of more segments of the data registers in parallel. Circuitry is also provided to handle redundancy.

In an embodiment, the invention is a programmable logic integrated circuit. The integrated circuit has n configuration bit inputs to input in parallel, n bits at a time, k configuration bits. The variable n is an integer greater than 1, k is greater than n, and k is a number of configuration bits in a frame for configuring the programmable logic of the programmable logic integrated circuit. The integrated circuit also has a data register to store at least the k configuration bits. The data register is divided into n segments and each of n configuration bits inputs is connected to input configuration bits at one of n segmentation nodes. In a specific embodiment, n is 8. The registers may be implemented or interchanged with latches, flip-flops, or other circuitry to implement the equivalent functionality.

Furthermore, the programmable logic integrated circuit may include a cyclic redundancy check (CRC) circuit, which is connected to a first the n configuration bit inputs. The cyclic redundancy check circuit performs a cyclic redundancy check on the configuration bits transferred through the first of the n configuration bit inputs. The circuitry will generate an error signal in the case of an error.

The programmable logic integrated circuit may also include a first multiplexer having a first input connected to a second configuration bit input of the n configuration bit inputs, a second input connected to a last register of a first segment of the data register, and a first multiplexer output connected to a first register of a second segment of the data register. The first register of the second segment is used to hold configuration data for a row L of the logic array blocks. A second multiplexer has a first input connected to the second configuration bit input of the n configuration bit inputs, a second input connected to a last register to hold configuration data for row L of the logic array block, and a second multiplexer output connected to a first register to hold configuration data for a row L+1 of the logic array blocks. When row L of logic array blocks is determined to be defective, data at the second configuration bit input of the n configuration bit inputs is output using the second multiplexer to the first register for row L+1 of the logic array blocks.

In a further embodiment, the invention is a method of configuring a programmable logic integrated circuit. A number of configuration bits are input into the programmable logic integrated circuit in parallel using a first input and a second input. The configuration bits provided by the first input are loaded starting at a first register of a first segment a data register. The first segment includes registers connected together in a serial chain. The configuration bits provided by the second input are loaded starting at a first register of a second segment the data register. The second segment also includes registers connected together in a serial chain In another embodiment, the invention is a programmable integrated circuit including a first data input and a second data input. A data register to hold configuration bits used to configure the programmable integrated circuit. The data register includes a first segment with a number of registers connected in a serial chain and a second segment with a number of registers connected in a serial chain. The first register of the first segment is connected to the first data input. A first multiplexer is connected to the second data input, a last register of the first segment, and a first register of the second segment. The first segment may have a different number of registers from the second segment. A number of static RAM cells may be configured using the configuration bits.

Furthermore, the first register of the second segment is for configuring a row L of the programmable integrated circuit. A second multiplexer is connected to the second data input, a register in the second segment which is a last register for row L, and a first register for a row L+1.

Other objects, features, and advantages of the present invention will become apparent upon consideration of the following detailed description and the accompanying drawings, in which like reference designations represent like features throughout the figures.

DETAILED DESCRIPTION

Figure 1:
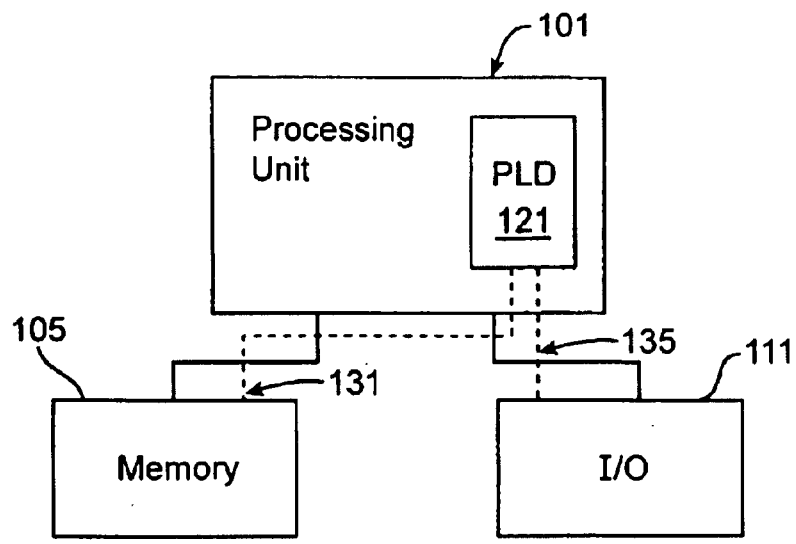
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. Nos. 4,871,930, 5,241,224, 5,258, 668, 5,260,610, 5,260,611, 5,436,575, and the Altera Data Book (1999), all incorporated by reference in their entirety for all purposes. Programmable logic integrated circuits and their operation are well known to those of skill in the art.

In the particular embodiment of FIG. 1, a processing unit 101 is connected to a memory 105 and an I/O 111 and incorporates a programmable logic device (PLD) 121. PLD 121 may be specially connected to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
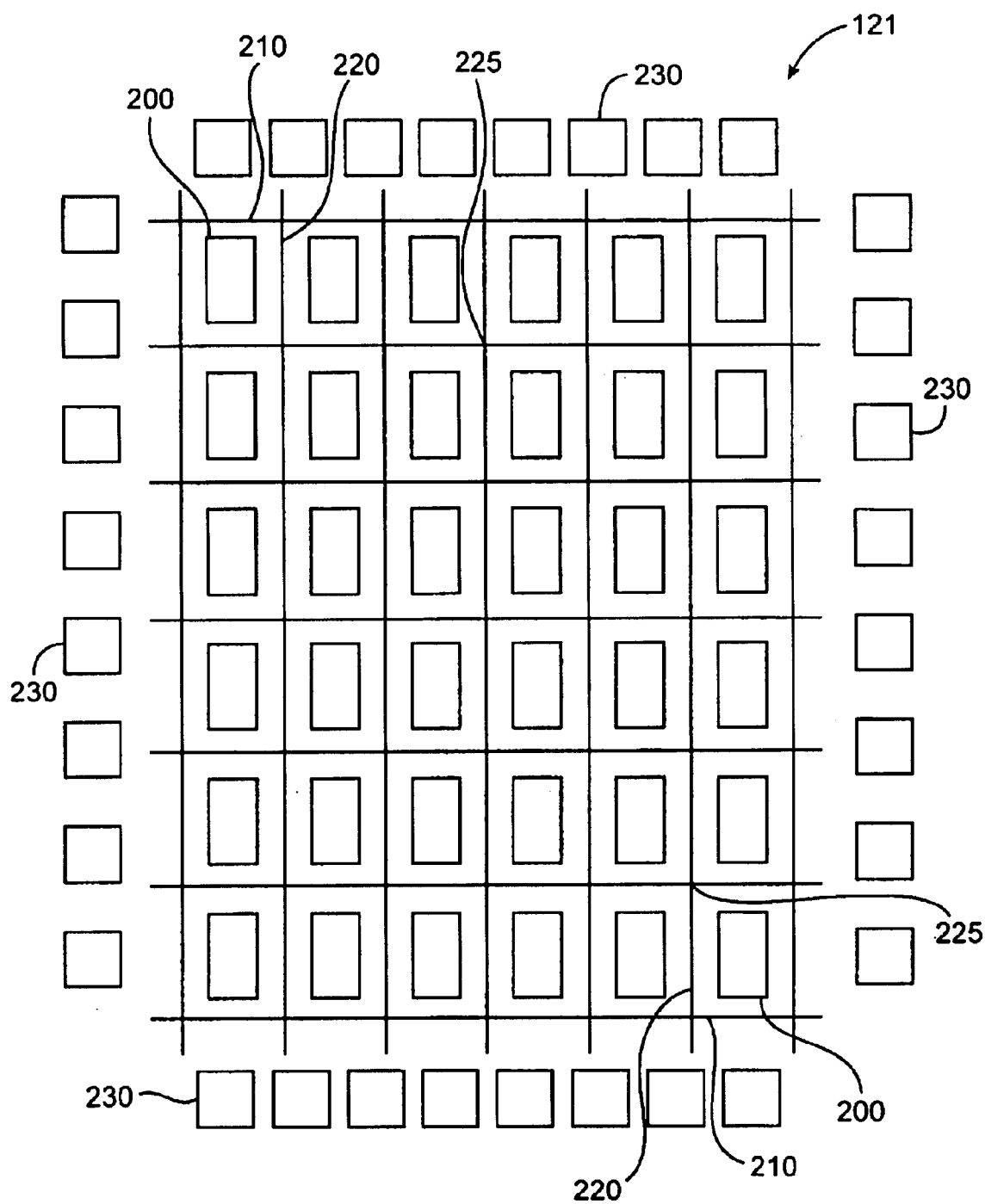
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a number of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a number of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
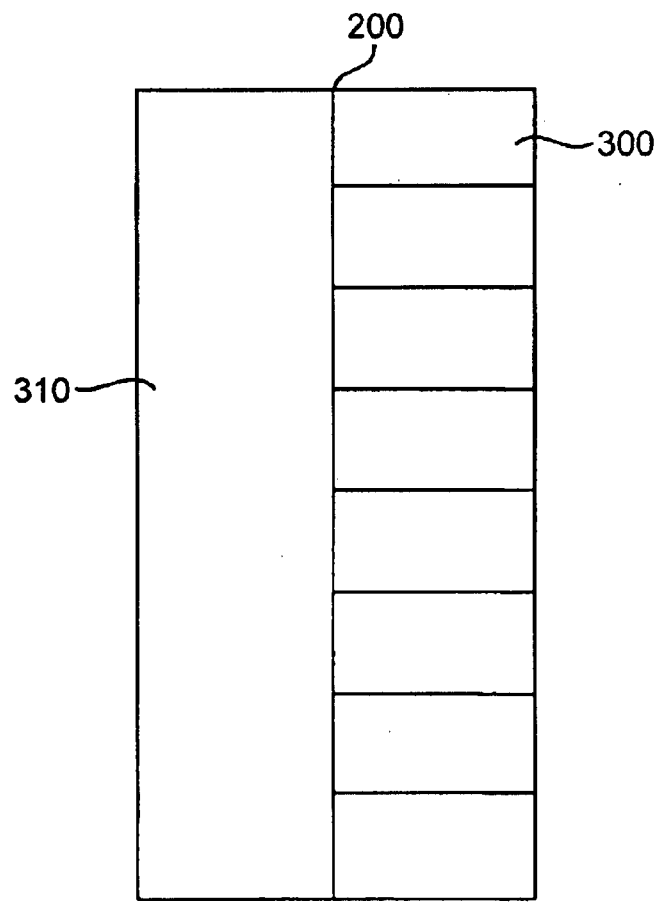
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. Some examples of function generators include product terms and look-up tables (LUTs). As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
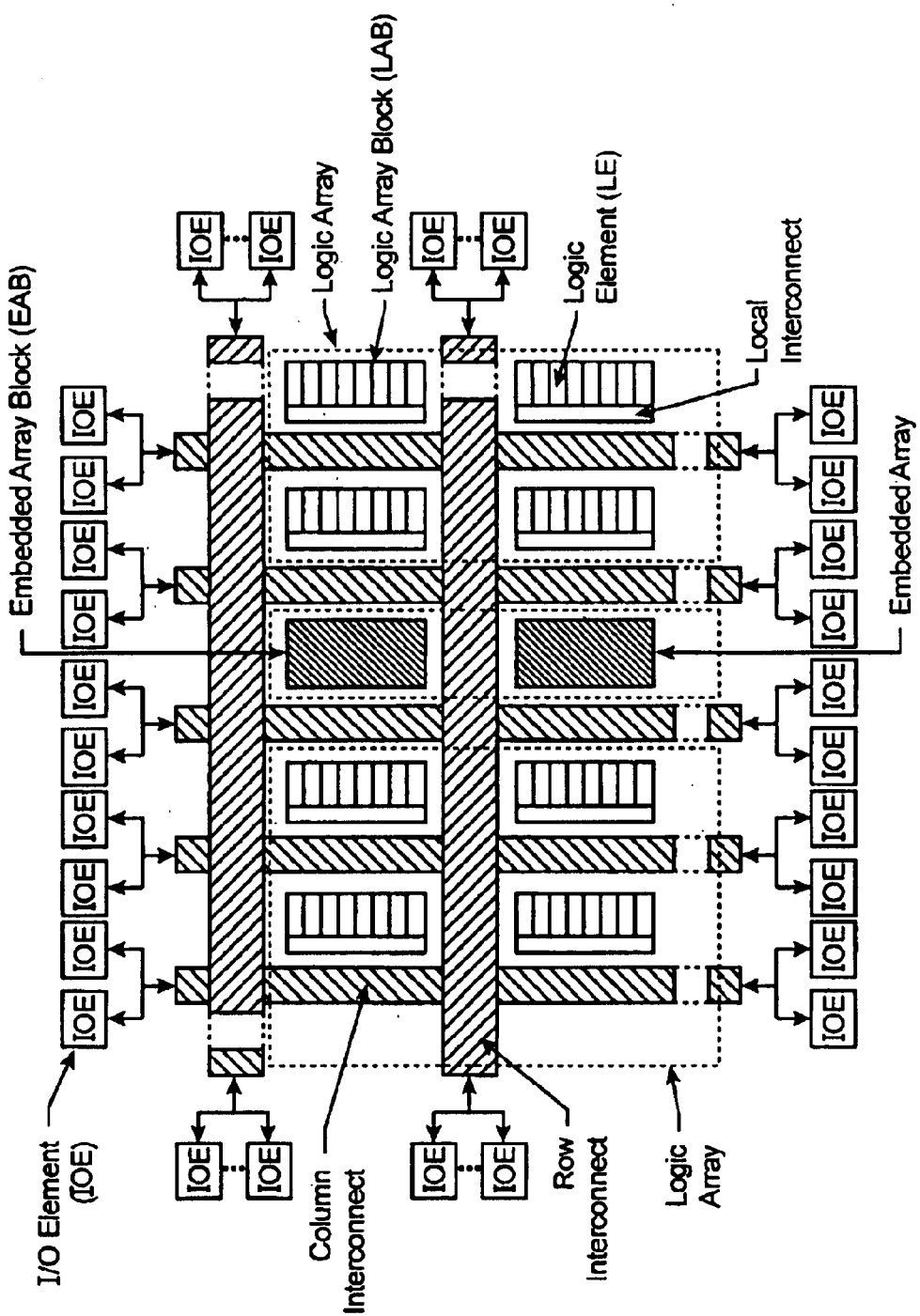
FIG. 4 shows a programmable logic integrated circuit architecture with embedded array blocks (EABs) or memory blocks.

FIG. 4 shows a PLD architecture similar to that in FIG. 2. The architecture in FIG. 4 further includes embedded array blocks (EABs). EABs contain user memory, a flexible block of RAM. More discussion of this architecture may be found in the Altera Data Book (1999) in the description of the FLEX 10K product family and also in U.S. Pat. No. 5,550,782, which are incorporated by reference.

Figure 5:
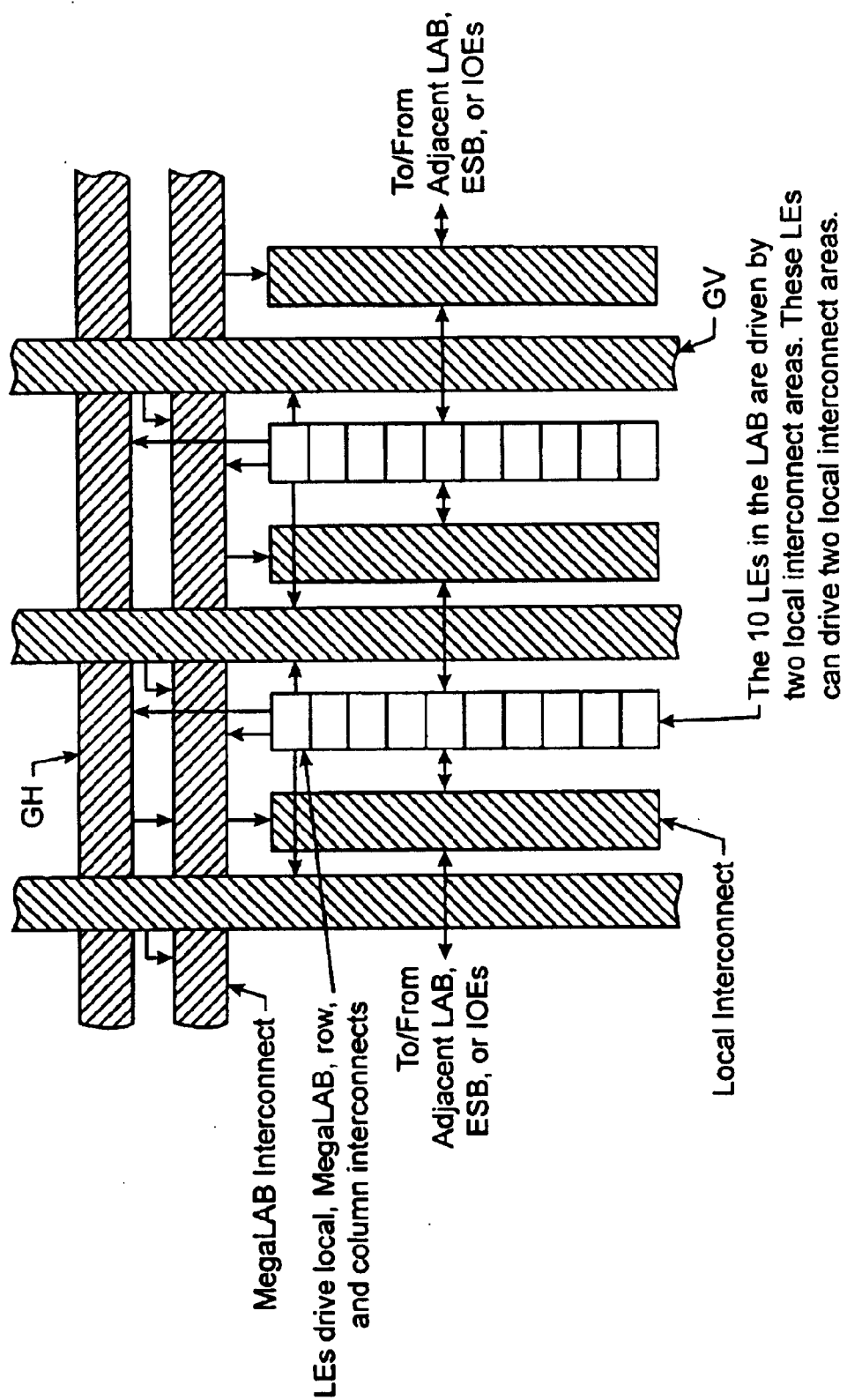
FIG. 5 shows a programmable logic integrated circuit architecture with meaaLABs.

FIG. 5 shows a further embodiment of a programmable logic integrated circuit architecture. FIG. 5 only shows a portion of the architecture. The features shown in FIG. 5 are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the megaLAB. Compared to the architecture of FIG. 2, this architecture has an additional level of interconnect, the megaLAB interconnect. Such an architecture is found in Altera's APEX™ family of products, which is described in detail in the APEX 20K Programmable Logic Device Family Data Sheet (August 1999), which is incorporated by reference. In a specific implementation, a megaLAB also includes an embedded system block (ESB) to implement a variety of memory functions such as CAM, RAM, dual-port RAM, ROM, and FIFO functions.

To configure a programmable logic integrated circuit, configuration bits are loaded into the programmable logic integrated circuit. Some techniques of configuring a programmable logic integrated circuit are discussed in U.S. Pat. No. 6,052,755, which is incorporated by reference. Nonvolatile and volatile programmable logic integrated circuits are both configured by the loading of configuration bits into the integrated circuit. The techniques of the invention may be applied to both nonvolatile and volatile programmable logic integrated circuits.

Nonvolatile programmable logic integrated circuits retain their configured or programmed information even after power is removed. The configuration information for nonvolatile programmable logic integrated circuits is held using nonvolatile memory cells such as floating gate, Flash, EEPROM, FRAM, ferroelectric, fuse, antifuse, magnetic, or other nonvolatile technology. Depending on the technology used, some nonvolatile programmable logic integrated circuits are one-time programmable and others may be programmed, erased, and reprogrammed many times. A nonvolatile programmable logic integrated circuit does not need to be reprogrammed each time it is powered up.

In contrast, volatile programmable logic integrated circuits do not retain their configured or programmed information after power is removed. The configuration information for volatile programmable logic integrated circuits is held using nonvolatile memory cells such as SRAM, RAM, DRAM, and other volatile technology. A volatile programmable logic integrated circuit needs to be reprogrammed each time it is power up. The configuration information is usually held in an external nonvolatile configuration memory such as a serial Flash or EPROM device. The external nonvolatile configuration memory may use one or more of the nonvolatile technologies listed above for nonvolatile programmable logic integrated circuits.

The configuration bits may be loaded in serial or parallel into the programmable logic integrated circuit. When loaded in serial, the bits are then loaded into a data register, such as a shift register, within the integrated circuit. The appropriate configuration memory bits are programmed using the information from the shift register. The shift register may also be referred to as a data register.

Figure 6:
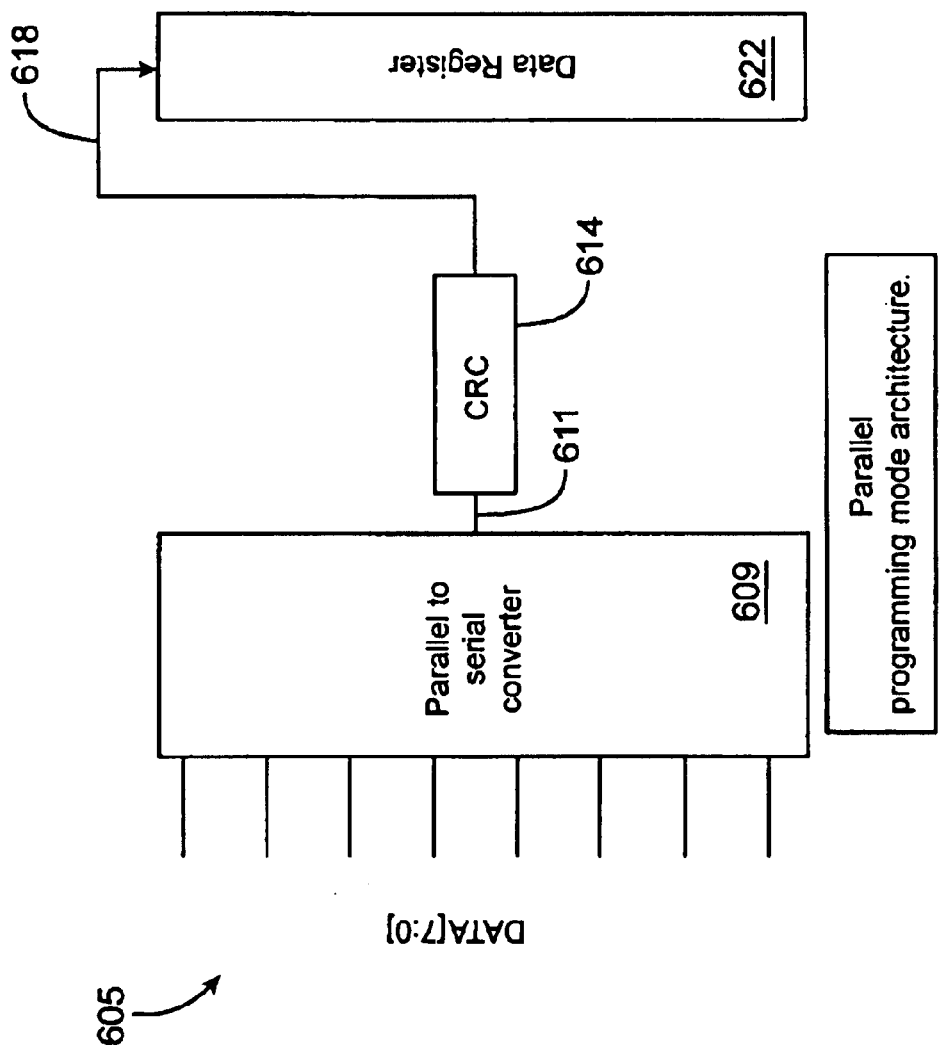
FIG. 6 shows a block diagram of circuitry for parallel loading of configuration bits into a programmable logic integrated circuit, and for serial handling the configuration bits internally.

When the configuration bits are loaded in into the integrated circuit in parallel, these bits may be handled internally in serial. FIG. 6 shows a block diagram of this approach. This technique may be referred to as "pseudo-parallel" because even though the bits are loaded in parallel, they are handled internally in serial. As shown in FIG. 6, configuration bits 605 are loaded in parallel and then serialized using a parallel-to-serial-converter circuit 609. In FIG. 6, eight bits, DATA[7:0], are loaded in parallel at a time. However, in other implementations, any number of bits, two or more, may be loaded in parallel. For example, 2, 4, 8, 12, 16, 32, or more bits may be loaded in parallel.

After the configuration bits are converted into serial form (at an output of the parallel-to-serial-converter circuit 611), these bits are handled in serial form for the rest of the configuration path, similar to the fully serial approach described above.

The configuration bits are checked using a cyclic-redundancy-check (CRC) circuit 614. The CRC circuit uses an algorithm to calculate a CRC value for the incoming bits and compares this CRC value to a CRC value input to the device. If the CRC values do not match, then some error or data corruption may have occurred when loading the bits, and bits should be reloaded. When an error occurs, the CRC check circuit triggers or generates a flag to indicate the error condition.

After the CRC check, the configuration bits are serially loaded using serial connection 618 into a data register 622. This data register is holds the configuration bits which are used to configure the device. This data register is connected to the programmable bits, and these programmable bits will be programmed or configured according to the configuration bits stored in the data register. For example, the data registered is loaded with a particular string of bits. These bits will be used to program the SRAM (or Flash) cells which configure the logic of the programmable logic integrated circuit.

There are many different ways to implement this data register. For example, the data register may be implemented using a shift register or a chain of D-type registers. The data register may be implemented using latches. In one implementation, the data register has a length or width of 2672 bits. However, the data register can be any length, more or less than 2672 bits. For example, there may be 100 or fewer bits, 1024, 3000, or 4000 or more bits. The length of the data register depends on a number of factors such as the number of rows and size of the programmable logic integrated circuit. The programmable logic integrated circuit is configured using the configuration bits loaded in the data registers. Configuration of the programmable logic may require more than one loading of bits of the data register, which may be referred to a data register frame.

Using the approach of FIG. 6, DATA[7:0] enters the data register serially after the CRC check. In this process, parallel data is serialized and serially clocked into the data register chain. However, by serializing the bits, this reduces the performance because the speed of the programming or configuration of an n-bit length data register frame is n cycles.

Figure 7:
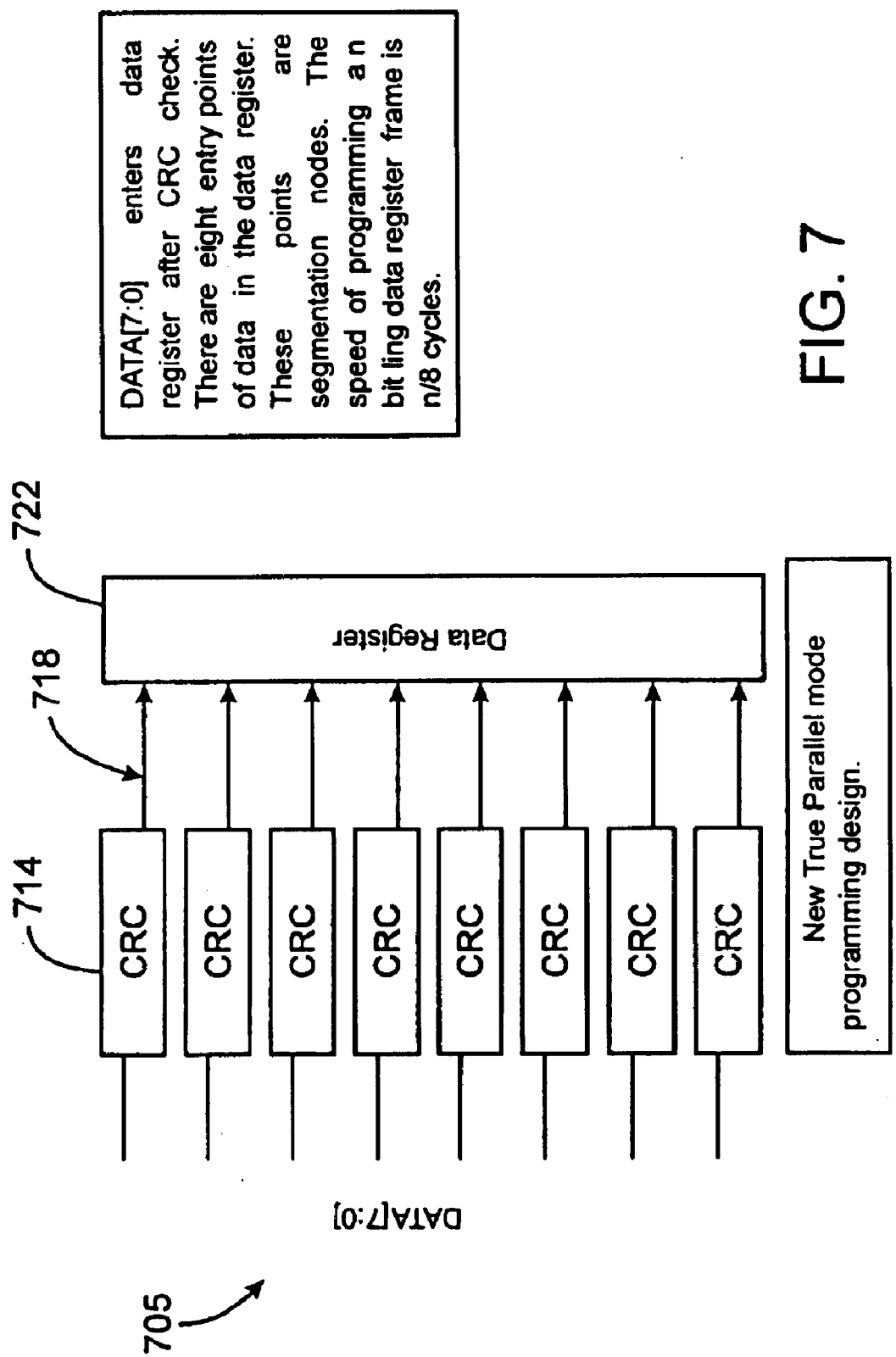
FIG. 7 shows a block diagram of circuitry for parallel loading of configuration bits into a programmable logic integrated circuit, and for parallel handling the configuration bits internally.

FIG. 7 shows another approach of configuring a programmable logic integrated circuit where the configuration bits are loaded into the integrated circuit in parallel and handled internally in parallel. In particular, the configuration bits will be loaded into the data register in parallel.

The configuration bits 705 are input in parallel into the integrated circuit, as in the FIG. 6 approach. Eight bits, DATA[7:0], are loaded in parallel at a time. However, in other implementations, any number of bits, two or more, may be loaded in parallel. For example, 2, 4, 8, 12, 16, 32, or more bits may be loaded in parallel. Each of these parallel bit streams is input into a number of CRC circuits 714 to check the integrity of the bit stream. In FIG. 7, there is one CRC circuit for each of the bit streams. However, in other implementations, to reduce the space taken up by the CRC circuit, two or more of the bits may be input into a single CRC circuit. For example, all parallel bits may be input into the same CRC circuit.

After the CRC circuit or circuits, the configuration bits are loaded into the data register 722 in parallel at multiple input points 718. Data register 722, similar to data register 622 of FIG. 6, holds a number of bits and is made up of a chain of individual registers, each capable of holding a single bit. There is one input point into the register for each of the parallel inputs 705 into the integrated circuit. This technique may be referred to as segmenting the data register. In the FIG. 7 example, the data register has eight segments. Each segment of the data register includes a number of registers, and each of the segments may or may not have exactly the same number of registers.

Whether each segment has exactly the same number of registers depends on whether the number of parallel inputs or segment, m, can be equally divided into the length of the data register. For example, if there are 8 inputs, but there are a total of 2689 registers (or bits) in the data register, then each segment will not have exactly the same number of registers (or bits). This is because 2689 does not divide evenly into 8; there is a remainder of 1. However, if there were 2688 registers, then 8 would divide evenly into 2688 and each segment would have 336 registers (or bits).

The variable "m" is eight in FIG. 7, but in other embodiments of the invention, there may be any number of segments, two or more. And, in one embodiment, the length of the data register is 2672.

In cases when each segment will not have exactly the same number of registers, an approach is to divide the data register into segments that are as similar length as possible. Any extra bits for each segment will supplied (e.g., generated by software) when creating the configuration bits for the programmable logic, but will be ignored the device is configured. The extra bits added to the configuration bit-stream may be referred to as "padding bits."

Since in this particular implementation, there are eight parallel streams, the technique may be referred to as parallel loading of an octasegmented data or shift register. In particular, DATA[7:0] enters the data register after the CRC check. There are eight entry points into the data register. There points may be referred to as segmentation nodes. The speed of the programming an n-bit length data register frame is n/m cycles, where m is 8 for and octasegmented data register. In comparison to the pseudo-parallel approach above in FIG. 6, configuration of the programmable logic using the FIG. 7 approach is significantly faster.

Figure 8:
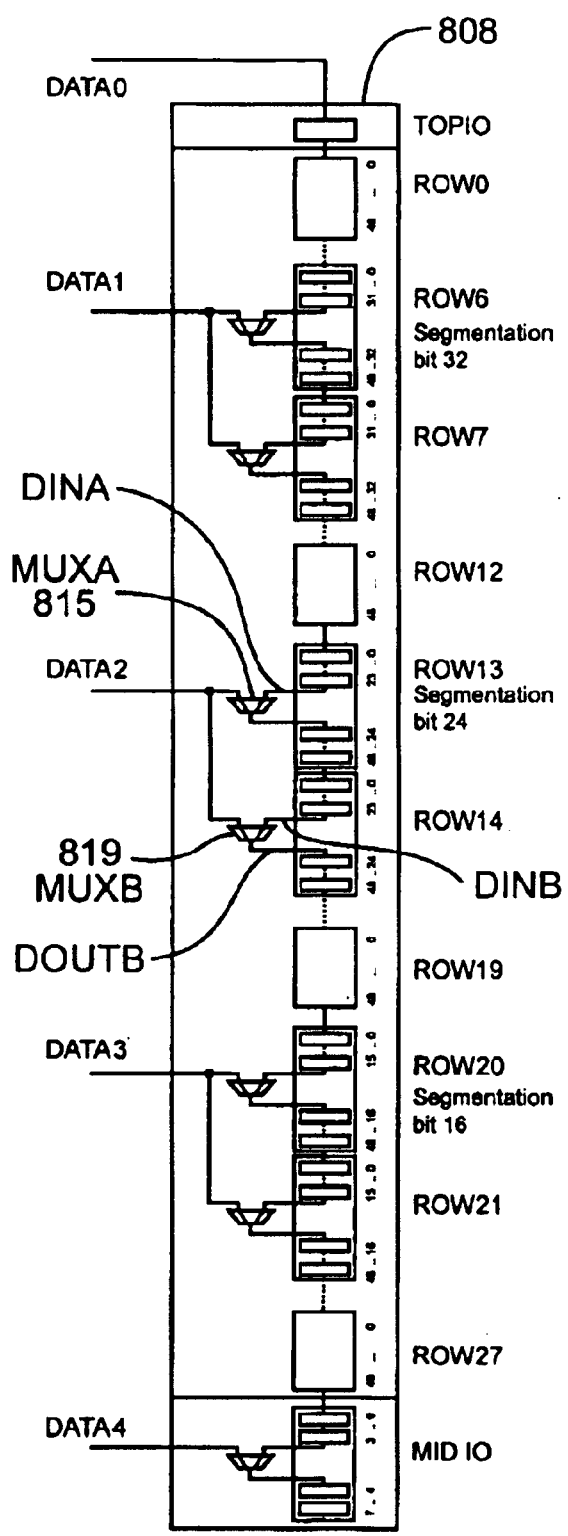
FIG. 8 shows a more detailed diagram of the circuitry and segmentation of the data register used for configuration of the programmable bits of the programmable logic integrated circuit.

FIG. 8 shows a more detailed diagram of the circuitry and segmentation of the data register 808. The figure shows a partial view for five of the data inputs, DATA0 to DATA4, into the data register. The first data input DATA0 is connected to the first register of the data register. Other data inputs, DATA1 to DATA4, are input at different segments of the data register using logic. In an implementation, the logic includes multiplexer circuits.

Figure 10:
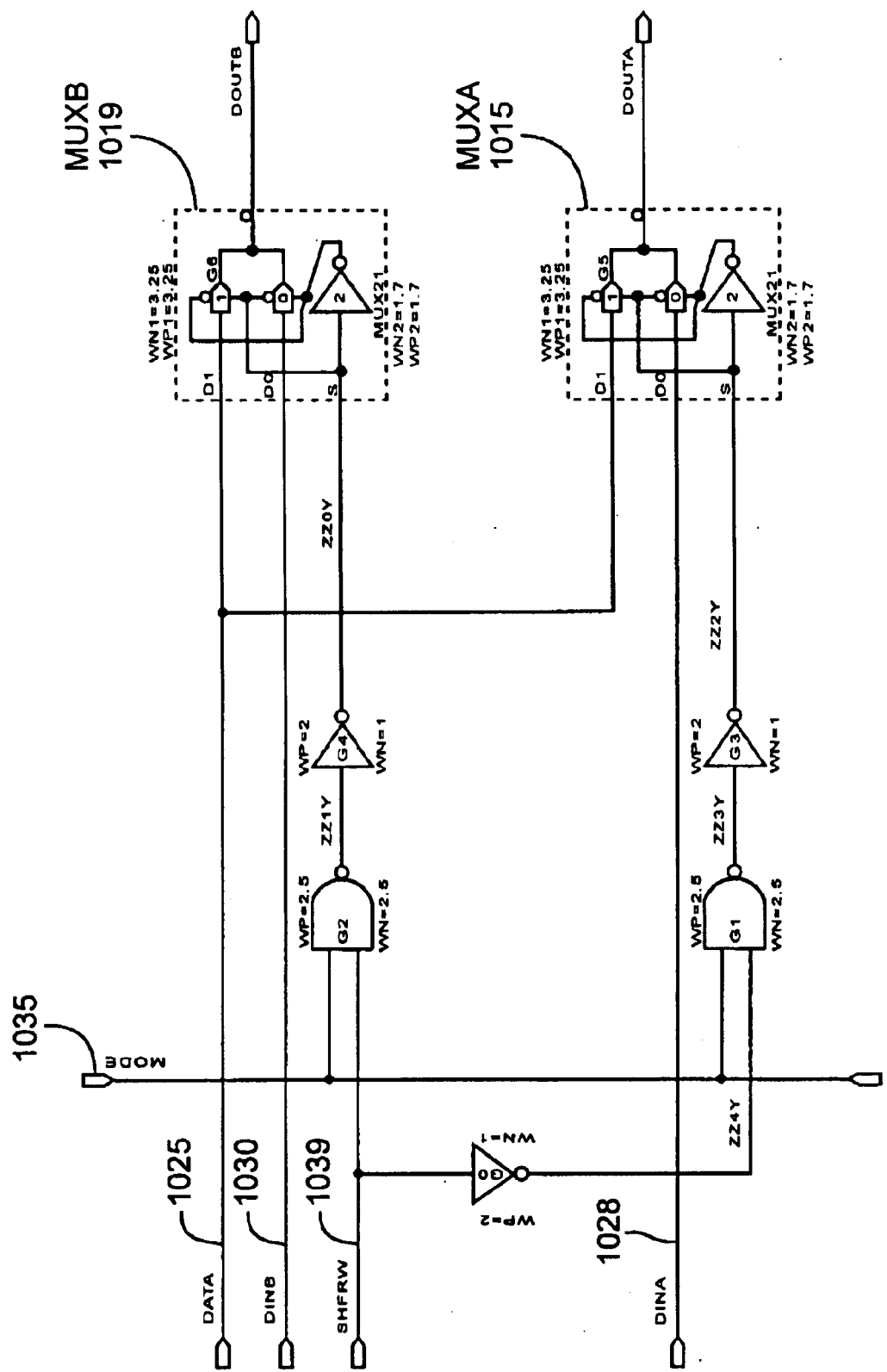
FIG. 10 shows a circuit implementation of the logical circuitry at each segment of the data register.

Specifically, at each segment node into the data register 808, the data inputs into two multiplexer circuits MUXA 815 and MUXB 819. FIG. 10 shows a more detailed diagram of an implementation of the multiplexer and related circuitry. There are many implementations (such as by way of pass gates and logic gates) of circuitry to obtain a similar function and result and any of these may be used to achieve the same functionality.

One input of both multiplexers MUXA and MUXB are connected to the data input (DATA). Another input DINA of MUXA is connected to an output of a register (e.g., register n) of the data register at the segmentation point. In other words, DINA is connected to an output of the last register of the previous segment. An output DOUTA of MUXA is connected to the input of the next register (e.g., register n+1) in the data register chain at the segmentation point. In other words, DOUTA is connected to an input of the first register of the next segment. Another input DINB of MUXB is connected to output of the last register of the row where the segmentation point is. For example, if row 13 has the segmentation point, then DINB will be connected to the last register of row 13.

These multiplexers and circuitry are used to provide compatibility between the serial loading and full parallel loading modes of the data register. Therefore, for example, users who prefer to load the programmable logic integrated circuit in serial may continue to do so, even when using a device that allows full parallel programming. Serial programming will be slower than full parallel programming.

The multiplexers and circuitry are also used to handle steering of the configuration bits to use the redundancy row, when needed. In particular, one technique of providing redundancy in a programmable logic integrated circuit is to provide an additional or spare row. This row is the redundancy row. When on of the existing regular rows of LABs in the PLD has a manufacturing or other defect so a LAB in that row does not function properly, the redundancy row is used to replace the defective row. The configuration circuitry handles routing the configuration bits around the defective row and into the redundancy row instead. The programmable logic integrated circuit may have more than one redundancy row and a similar approach as shown in this figure may be used.

MUXA is used to provide route the configuration bits properly depending on whether serial or programming mode is selected. If in parallel mode, MUXA outputs DATA into the first register of the next segment. If in serial mode, MUXA connects the serial chain from the last register is the last segment to the first register in the next segment. Data can then be shifted in serial fashion through the shift register.

MUXB is used to handle steering data to for redundancy purposes. Once it is determined a particular row is defective, the configurations bits should be routed around this row. The configuration bits for the defective row and succeeding rows below the defective row will all be shifted one row down. If a row is to be skipped, MUXB directs DATA to the next row. The segmented is disconnected from the serial register chain.

Figure 9:
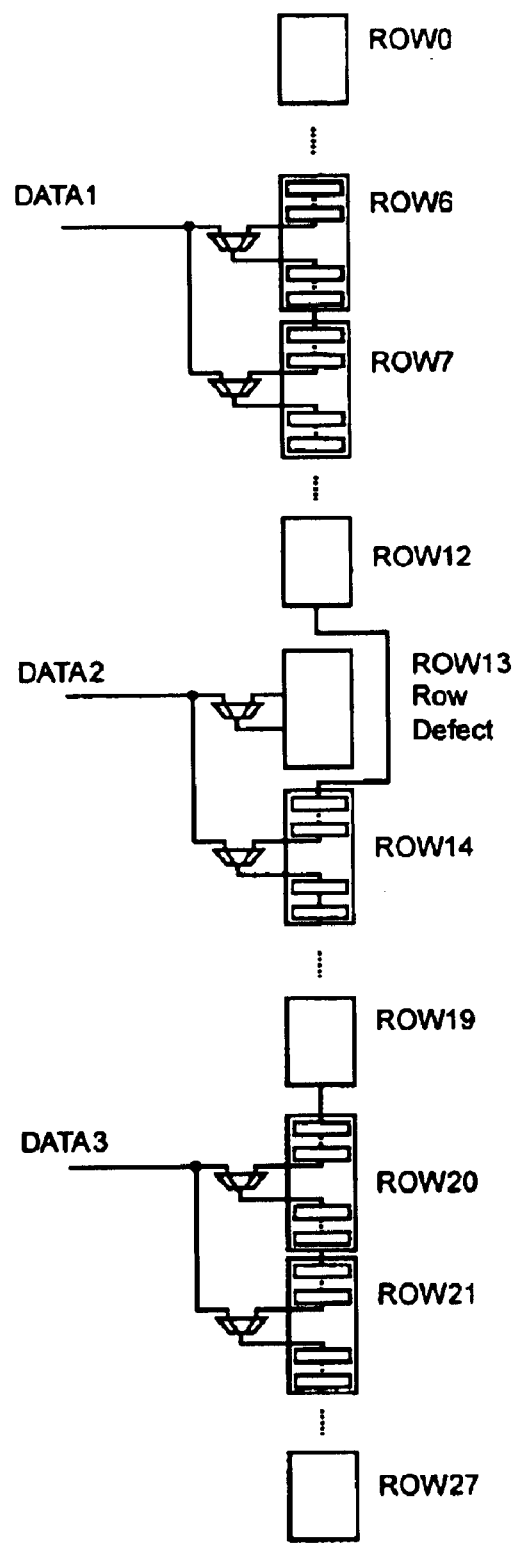
FIG. 9 shows how the data register handles the situation where there is a defective row in the programmable logic integrated circuit, where the defective row is replaced by a redundancy row.

FIG. 9 shows how a defective row is handled. Row 13 is defective. So, the logic is configured to skip row 13. Data from row 12 is routed to row 14. Configuration data from input DATA2 is routed into row 14 instead of row 13. And at subsequent segment nodes, the configuration data is routed one row down. For example, configuration data input at DATA3 is routed into row 21, instead of row 20.

FIGS. 8 and 9 show the configuration bits are shifted down in the data register. However, in other embodiments, the configuration bits may instead be shifted up, to the left, to the right, or any other direction.

To summarize, in a specific implementation, to program the RAM or SRAM memory cells of a PLD, a data register is used. This data register is a string of flip-flops arranged to form a shift register. In a serial programming mode and the pseudo-parallel programming mode (see FIG. 6), the data register is loaded with the lower or least significant bit (LSB) followed by rest of the data in that frame and shifted down to occupy the total length of data register. In the parallel programming mode (see FIG. 7), the data register is divided into eight approximately equal segments. In other embodiments, there may be any number of segments, two or more, three, four, five, six, ten, twelve, and more. Inside each segment data is serially shifted at one bit per clock, like in serial programming mode. Input to this shift register sequence is from DATA[7:0]. This makes the data register a parallel loaded octasegmented shift register. This minimizes layout area and die size. The nodal points of segmentation can be defined to make eight approximately equal segments. At these nodal points a multiplexer is implemented to steer data into the data register.

FIG. 6 shows a programmable logic integrated circuit with a pseudo-parallel programming circuit. A serializer circuit converts parallel input data to a serial stream. Similar to serial programming, serial data is shifted into the data register. For a data register of length n=2672 bits, 2675 clock cycles are needed to program one frame. In comparison, the fully parallel programming design is 8 times faster than the pseudo-parallel programming design. In the fully parallel design, the total number of clock cycles needed to program one frame of data is n/8=335 clock cycles. This is achieved by having nodal points of segmentation such that the eight segments are closest to equal length. By traveling the nodal positions, the eight segments do not differ in length by more than one bit. This reduces a number of dummy bits that are introduced (taken care of by software) ahead of the data bits of shorter segments. This design can program a PLD using minimum memory.

A further benefit of the fully parallel design is that there is little, if any, additional die size expense or routing requirements over a pseudo-parallel design.

A CRC check circuit performs CRC check on each of these eight inputs. By splitting the length of the data register into eight parts, the CRC check is performed on a smaller length of data, hence improving error detection. The CRC check may be also be designed so that eight parallel inputs can be concurrently used to calculate CRC bits to identify errors in data.

FIG. 10 shows a circuit implementation of the logical circuitry at each segment. There are two multiplexers MUXA 1015 and MUXB 1019. Multiplexer circuit 1015 is an implementation of multiplexer MUXA 815, and multiplexer circuit 1019 is an implementation of multiplexer 819. There are other ways and circuits to implement a multiplexer function, and any of these may be used.

DATA is input into both multiplexers using a data input 1025. DINA 1028 is input into a second input of MUXA, and DINB 1030 is input into a second input of MUXB. The outputs of multiplexers are selected by using two control signals MODE 1035 and SHFRW 1039. MODE indicates whether data is loaded into the data register in parallel or in serial. For serial mode, MODE will be logic 0 and for parallel mode, MODE will be logic 1. SHFRW or shift row indicates whether the configuration bits should be shifted one row down. In normal mode, SHFRW will be 0 and data is not shifted. If redundancy mode is to be enabled, SHFRW will be 1 and bits at the DATA input will be shifted down to the next row.

Logic gates are used to implement the control logic of the pass gates. MUXB is controlled by ANDing MODE and /SHFRW (not SHFRW). The logic used to implement this is a NAND gate and an inverter, but other logic gates and circuits may be also used to obtain similar functionality. Similarly, MUXA is controlled by ANDing MODE and SHFRW. The following table summarizes the functionality of the circuitry.

"X" represents a don't care, "0" represents a logic low, and "1" represents a logic high.

TABLE

| Segmentation Node Multiplexer Logic | | | |
|---|---|---|---|
| MODE<br>0 = Serial<br>1 = Parallel | SHFRW<br>0 = Normal<br>1 = Redundancy Engaged | Output at<br>DOUTA | Output at<br>DOUTB |
| 0 | X | DINA | DINB |
| 1 | 0 | DATA | DINB |
| 1 | 1 | DINA | DATA |

For the segmentation multiplexer logic, in parallel programming mode, DATA is an input entry point for one of the DATA[7:0] inputs. DOUTA and DOUTB are at adjacent rows. DATA is routed to DOUTA during normal operation and to DOUTB when redundancy is engaged. DINA and DINB are data register data from predecessor bits. During serial programming, DOUTA follows DINA and DOUTB follows DINB. The SHFRW signal indicates redundancy.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A programmable logic integrated circuit comprising:

n configuration bit inputs to input in parallel, n bits at a time, k configuration bits into the programmable logic integrated circuit, wherein n is an integer greater than 1, k is greater than n, and k is a number of configuration bits in a frame for configuring the programmable logic of the programmable logic integrated circuit; and a data register to store at least the k configuration bits, wherein the data register is divided into n segments that each have a plurality of registers coupled in a serial chain, and each of the n configuration bit inputs is coupled to input configuration bits at one of n segmentation nodes, wherein the n segmentation nodes are coupled to inputs of the n segments.

2. The programmable logic integrated circuit of claim 1 wherein k is 2672 bits or greater.

3. The programmable logic integrated circuit of claim 1 wherein the clock cycles needed to input a frame of data will be about k divided by n.

4. An electronic system comprising a programmable logic integrated circuit as recited in claim 1.

5. A programmable logic integrated circuit comprising:

n configuration bit inputs to input in parallel, n bits at a time, k configuration bits into the programmable logic integrated circuit, wherein n is an integer greater than 1, k is greater than n, and k is a number of configuration bits in a frame for configuring the programmable logic of the programmable logic integrated circuit;

a data register to store at least the k configuration bits, wherein the data register is divided into n segments and each of the n configuration bit inputs is coupled to input configuration bits at one of n segmentation nodes; and a cyclic redundancy check circuit, coupled to a first the n configuration bit inputs, to perform a cyclic redundancy check on the configuration bits transferred through the first of the n configuration bit inputs.

6. The programmable logic integrated circuit of claim 5 wherein when a cyclic redundancy check error is detected, generating a signal to indicate the error.

7. A programmable logic integrated circuit comprising:

n configuration bit inputs to input in parallel, n bits at a time, k configuration bits into the programmable logic integrated circuit, wherein n is an integer greater than 1, k is greater than n, and k is a number of configuration bits in a frame for configuring the programmable logic of the programmable logic integrated circuit; and a data register to store at least the k configuration bits, wherein the data register is divided into n segments and each of the n configuration bit inputs is coupled to input configuration bits at one of n segmentation nodes, wherein n is 8 and each of the segments does not have the same number of registers.

8. A programmable logic integrated circuit comprising:

n configuration bit inputs to input in parallel, n bits at a time, k configuration bits into the programmable logic integrated circuit, wherein n is an integer greater than 1, k is greater than n, and k is a number of configuration bits in a frame for configuring the programmable logic of the programmable logic integrated circuit;

a data register to store at least the k configuration bits, wherein the data register is divided into n segments and each of the n configuration bit inputs is coupled to input configuration bits at one of n segmentation nodes;

a first multiplexer having a first input coupled to a second configuration bit input of the n configuration bit inputs, a second input coupled to a last register of a first segment of the data register, and a first multiplexer output coupled to a first register of a second segment of the data register; wherein the first register of the second segment is used to hold configuration data for a row L of the logic array blocks; and a second multiplexer having a first input coupled to the second configuration bit input of the n configuration bit inputs, a second input coupled to a last register to hold configuration data for row L of the logic array block, and a second multiplexer output coupled to a first register to hold configuration data for a row L+1 of the logic array blocks.

9. The programmable logic integrated circuit of claim 8 wherein when row L of logic array blocks is determined to be defective, data at the second configuration bit input of the a configuration bit inputs is output using the second multiplexer to the first register for row L+1 of the logic array blocks.

10. A programmable logic integrated circuit comprising:

n configuration bit inputs to input in parallel, n bits at a time, k configuration bits into the programmable logic integrated circuit, wherein n is an integer greater than 1, k is greater than n, and k is a number of configuration bits in a frame for configuring the programmable logic of the programmable logic integrated circuit; and a data register to store at least the k configuration bits, wherein the data register is divided into n segments and each of the n configuration bit inputs is coupled to input configuration bits at one of n segmentation nodes, wherein the data register comprises registers to store m dummy data bits, and the dummy data bits will be supplied by software used to configure the programmable logic integrated circuit.

11. A method of configuring a programmable logic integrated circuit comprising:

inputting a plurality of configuration bits into the programmable logic integrated circuit in parallel using a first input and a second input;

loading the configuration bits provided by the first input starting at a first register of a first segment a data register, wherein the first segment comprises registers coupled together in a serial chain; and loading the configuration bits provided by the second input starting at a first register of a second segment the data register, wherein the second segment comprises registers coupled together in a serial chain.

12. The method of claim 11 further comprising:
when a defective row L of the logic array blocks is in second segment, loading the configuration bits provided by the second input starting at a first register of a row L+1 of the logic array blocks.

13. The method of claim 11 further comprising:
performing cyclic redundancy checking on the configuration bits provided by only the first input; and
performing cyclic redundancy checking on the configuration bits provided by only the second input.

14. The method of claim 11 performing cyclic redundancy checking on the configuration bits provided by the first input and the second input.

15. The method of claim 11 wherein the configuration bits are used to program static RAM, Flash, or EEPROM cells of the programmable logic integrated circuit.

16. A programmable integrated circuit comprising:
a first data input;
a second data input;
a data register to hold configuration bits used to configure the programmable integrated circuit, wherein the data register comprises a fist segment comprising a plurality of registers coupled in a serial chain and a second segment comprising a plurality of registers coupled in a serial chain,
wherein the first register of the first segment is coupled to the first data input; and
a first multiplexer coupled to the second data input, a last register of the first segment, and a first register of the second segment.

17. The programmable integrated circuit of claim 16 wherein the first register of the second segment is for configuring a row L of the programmable integrated circuit, and further comprising:
a second multiplexer coupled to the second data input, a register in the second segment which is a last register for row L, and a first register for a row L+1.

18. The programmable integrated circuit of claim 16 further comprising:
a plurality of static RAM cells which will be configured by the configuration bits.

19. The programmable integrated circuit of claim 16 wherein data provided at the first data input and the second data input are input in parallel into the programmable integrated circuit.

20. The programmable integrated circuit of claim 16 wherein in parallel, first data input via the first data input is input to the first segment of the data register and second data input via the second data is input to the second segment of the data register.

21. The programmable integrated circuit of claim 16 wherein the first segment has a different number of registers from the second segment.

22. An electronic system comprising a programmable integrated circuit as recited in claim 16.

* * * * *